U.S. Patent Number: 5,532,704
Date of Patent: Jul. 2, 1996

United States Patent [19]
Ruelle

[54] DEVICE FOR POSITIONING ANTENNAS INSIDE A MEASURMENT CHAMBER OF THE ANECHOIC OR OF THE SEMI-ANECHOIC TYPE

[75] Inventor: Philipe Ruelle, Pluneret, France

[73] Assignee: SIEPEL-Societe Industrielle d'Etudes et Protection Electroique, La Trinite-Sur-Mer, France

[21] Appl. No.: 260,378

[22] Filed: Jun. 14, 1994

[30] Foreign Application Priority Data

Jun. 15, 1993 [FR] France ................................. 93 07178

[51] Int. Cl.⁶ .............................. H01Q 1/12; G01R 29/08
[52] U.S. Cl. .......................... 343/703; 343/757; 343/877; 174/35 MS
[58] Field of Search ..................... 343/703, 757, 343/872, 758, 878, 879, 877; 174/35 MS; H01Q 1/12; G01R 29/08

[56] References Cited

FOREIGN PATENT DOCUMENTS

| | | |
|---|---|---|
| 2623288 | 11/1987 | France . |
| 2631452 | 5/1988 | France . |
| 4-102073 | 4/1992 | Japan ..................................... 343/703 |
| 6-160449 | 6/1994 | Japan ..................................... 343/703 |

OTHER PUBLICATIONS

IEEE Transactions of Antennas and Propagation vol. AP-21, No. 4; juillet 1973, New York US pp. 490–498 Appel-–Hansen 'Reflectivity Level of Radio Anechoic Chambers' p. 496, alinéa 2; figure 10.
Patent Abstracts of Japan vo. 16, No. 476 (P-1430) 5 Oct. 1992 & JP-A-04 169 865 (Ishino Takeshi) 17 Jun. 1992 *abrégé*.

*Primary Examiner*—Hoanganh Le
*Attorney, Agent, or Firm*—Sixbey, Freidman Leedom & Ferguson; Gerald J. Ferguson, Jr.; Tim L. Brackett, Jr.

[57] ABSTRACT

The invention relates to a device for positioning antennas, the device comprising an assembly having an antenna-carrier mast movably mounted in a reserve provided between a particular absorbent wall of the measurement chamber and the adjacent wall of the envelope of the chamber; the mast passes through the particular wall via an associated slot to extend into the measurement chamber, each antenna is mounted to slide along the mast without interfering mechanically with any other antenna carried by the mast, thereby making it possible to position a desired antenna at a desired location while retracting the other antennas inside the reserve, behind the above-mentioned particular wall.

10 Claims, 4 Drawing Sheets

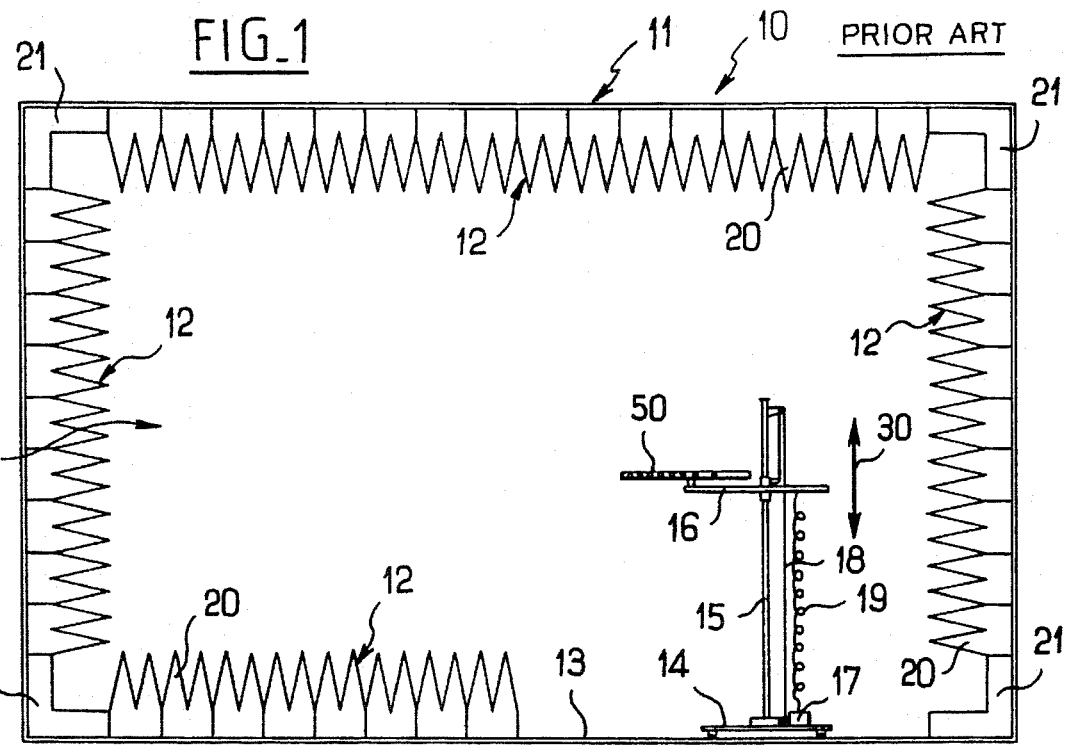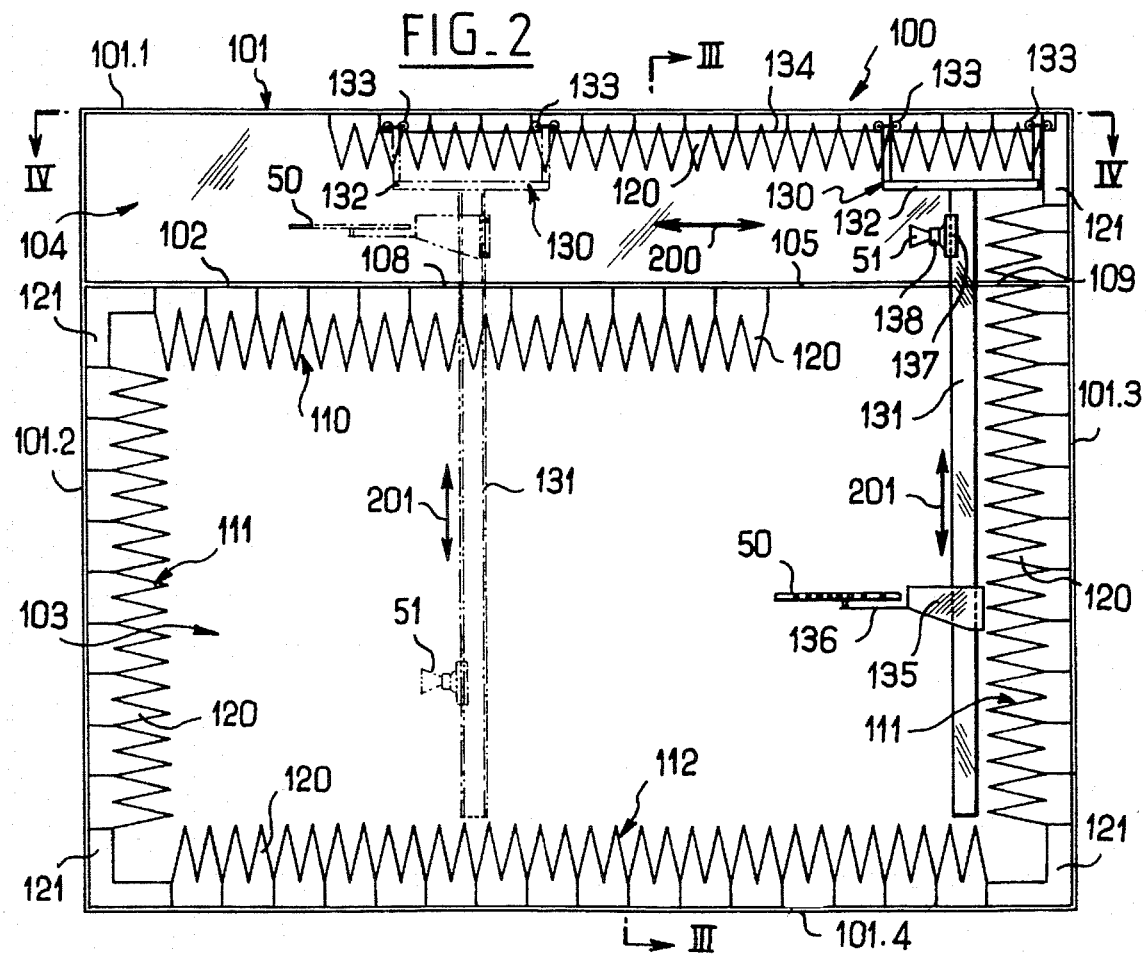

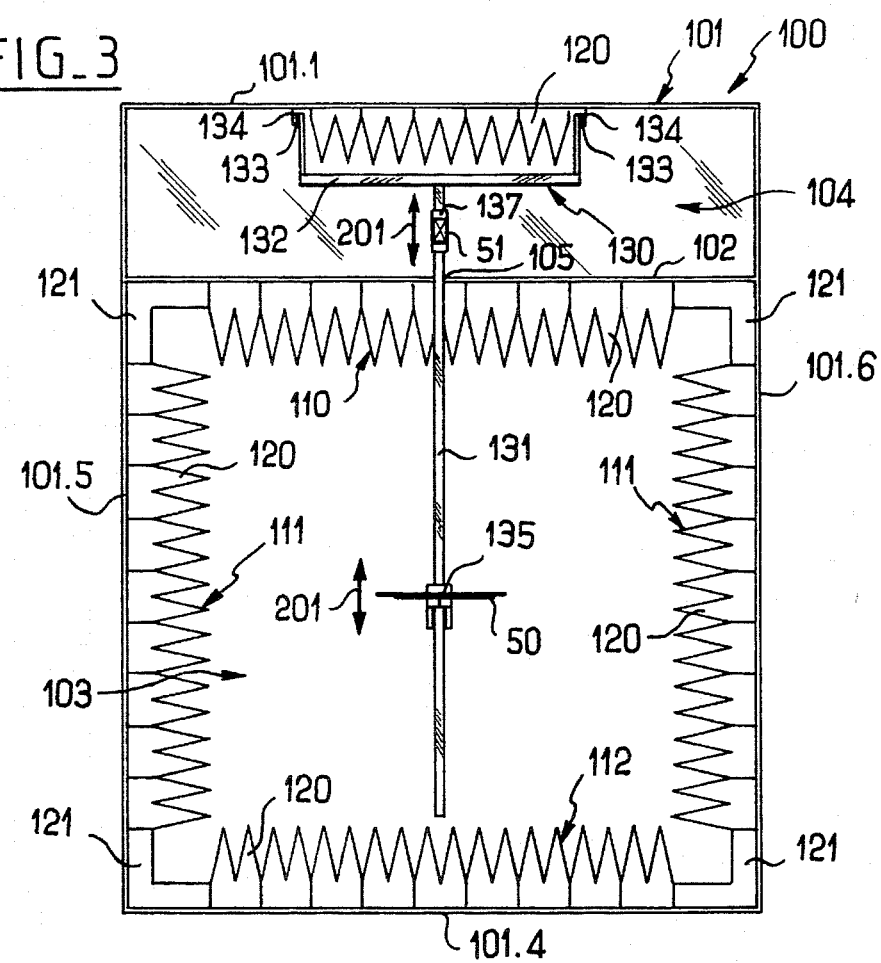
FIG_3
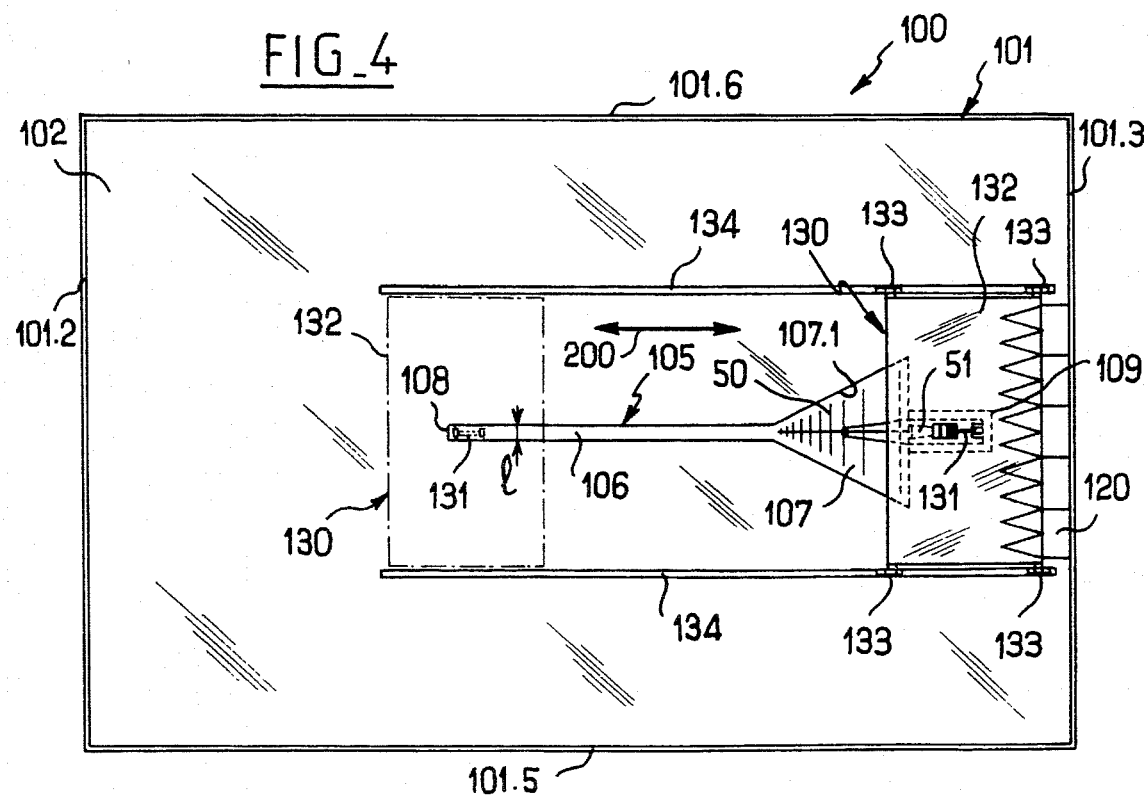
FIG_4

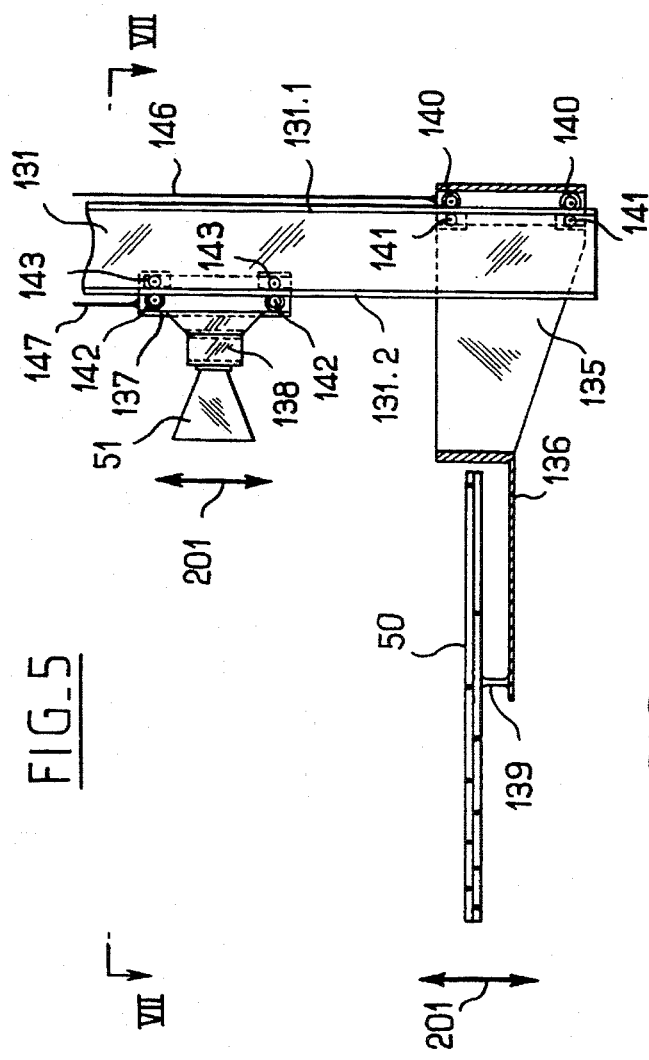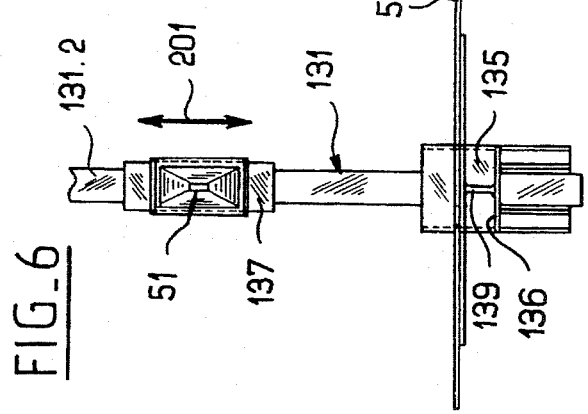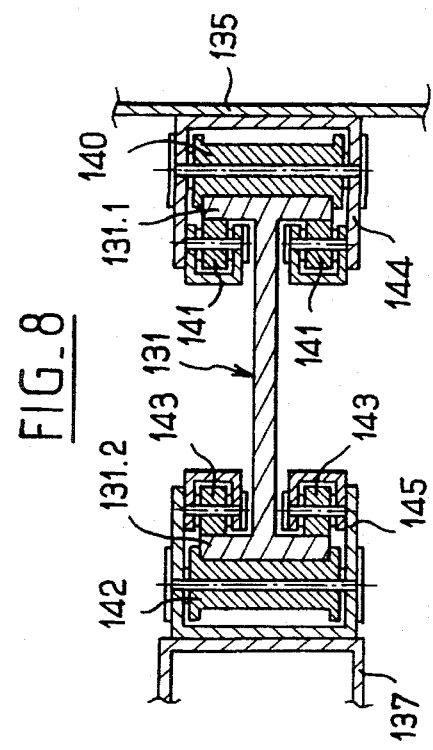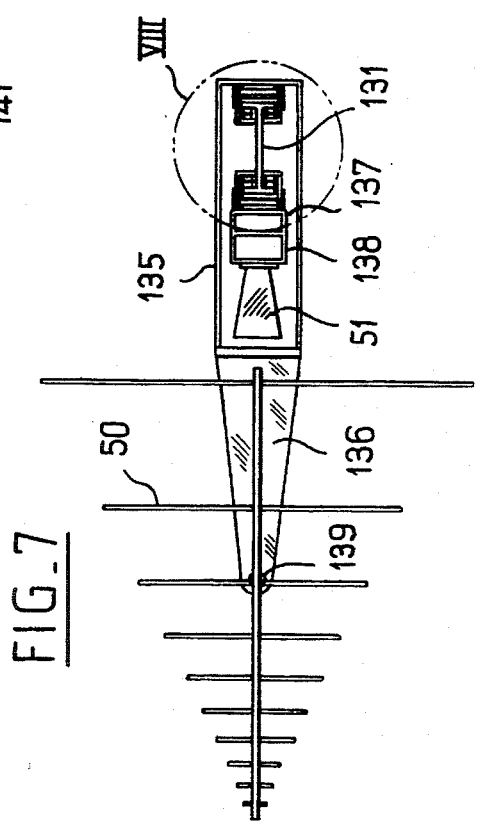

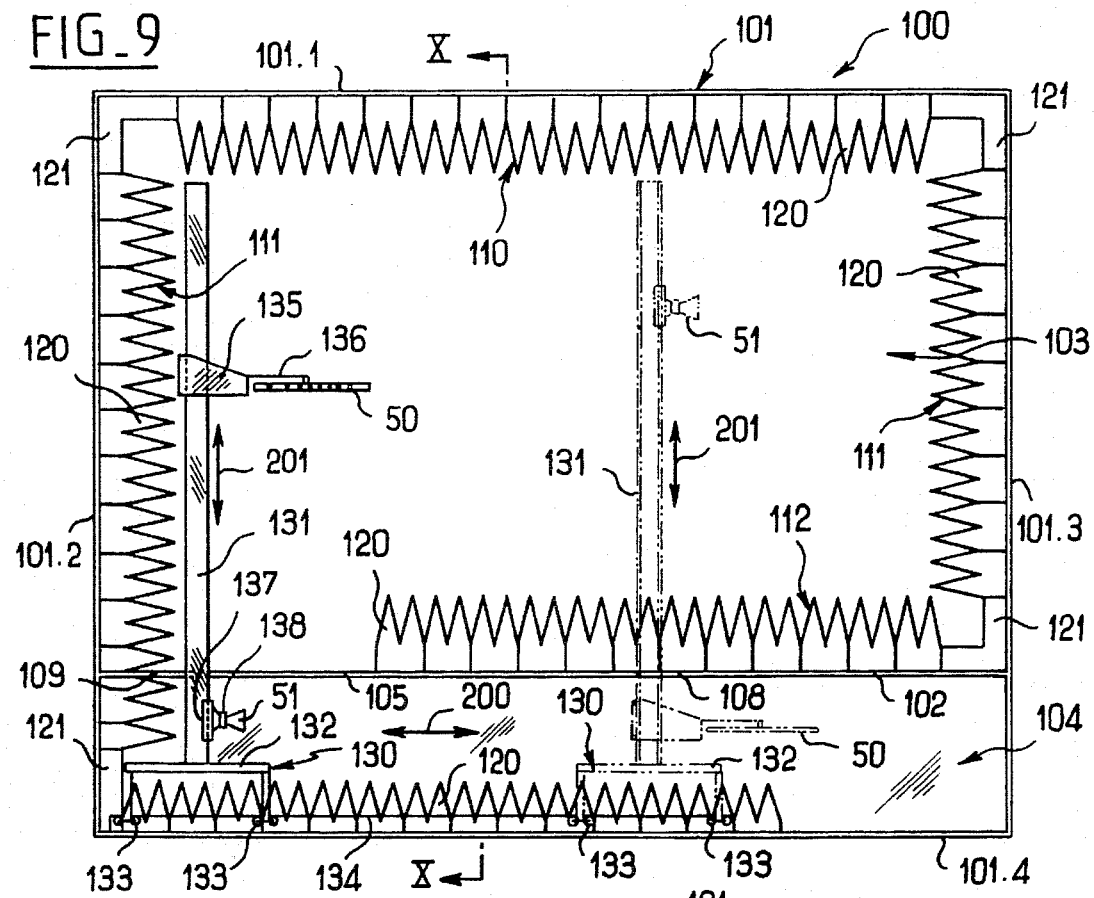
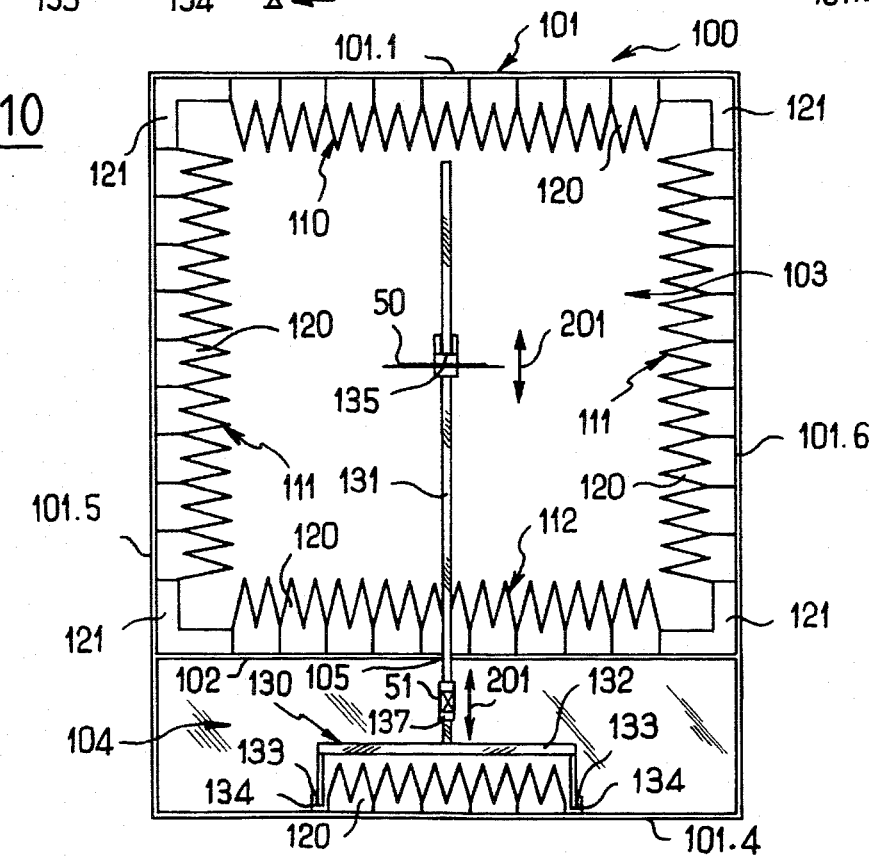

DEVICE FOR POSITIONING ANTENNAS INSIDE A MEASUREMENT CHAMBER OF THE ANECHOIC OR OF THE SEMI-ANECHOIC TYPE

The present invention relates to positioning antennas inside measurement chambers of the anechoic or of the semi-anechoic type.

BACKGROUND OF THE INVENTION

Such chambers are constituted by an envelope inside which electromagnetically absorbent blocks are disposed that form the absorbent walls of the chamber. For a chamber of the anechoic type, all of the walls are covered in electromagnetically absorbent materials, whereas for a chamber of the semi-anechoic type, the floor does not include electromagnetically absorbent blocks (see FR-A-2 631 452, FR-A-2 623 288, JP-A-04 169 865).

Such enclosures lined fully or partially with blocks that absorb electromagnetic waves are commonly used for testing antennas or for measuring the levels of radiation from equipment over a given frequency range, and this applies to various technical fields (motor vehicles, satellites, telephones, etc. . . . ), with such measurements making it possible, for example, to verify that such-and-such specific low-current equipment operates properly even when in a high level of electromagnetic field at given frequencies corresponding to the type of equipment in question.

The positioning of antennas in such an installation is conventionally organized by using a carriage on which a vertical mast is mounted that supports an antenna (or sometimes two antennas) with the option of adjusting the height thereof.

Such a known positioning device is shown in FIG. 1.

That figure shows a measurement chamber 10 (in longitudinal section) constituted by a rectangular parallelepiped enclosure 11 having electromagnetically absorbent blocks disposed therein (e.g. absorbent cones 20 and absorbent angle members 21) that constitute the absorbent walls 12 that define the inside volume 40 of the chamber. In the present case, a portion of the floor 13 is free from absorbent blocks in order to provide a plane along which the carriage 14 can move. The carriage 14 caries a vertical mast 15 on which there slides a support 16 whose height is adjustable by means of a system comprising a motor 17 and a halyard 18, as represented diagrammatically by arrow 30, and on which a coaxial connection 19 is fastened. A wire-type antenna 50 is mounted on the support 16 and the position of the antenna within the inside space 40 is thus appropriately adjusted for the purpose of a particular test or measurement.

When it is desired to change the antenna in order to perform a test or a measurement in another frequency range, e.g. using a microwave horn, it is necessary to stop the current test, to penetrate into the chamber, to remove the antenna from the mast, and to install another antenna that is compatible with the new frequency range in which it is desired to work, and finally to reposition the new antenna in the desired location.

Those various operations require a considerable amount of time (in general at least one hour), thereby greatly increasing the cost of the tests or measurements performed. Also, in an anechoic measurement chamber, it is necessary to remove absorbent blocks in order to gain access to the carriage.

To avoid such constraints, proposals have been made to modify the structure of the above device so as to make it possible to mount two antennas on the mast of the carriage. However, in practice, it is not possible to leave both antennas simultaneously in place since the unused antenna constitutes a source of non-negligible disturbance to the electromagnetic field. It is then necessary for the operator to go back into the chamber and remove the antenna that is not in use, and such movement naturally disturbs any equilibrium that may previously have been established in the chamber.

OBJECTS AND SUMMARY OF THE INVENTION

A particular object of the invention is to solve that problem by designing a novel positioning means that avoids the above-specified drawbacks.

An object of the invention is thus to provide an antenna positioning device making it possible firstly to use two or more antennas without requiring any of them to be removed, and secondly to enable an antenna to be changed quickly without such a change giving rise to significant disturbances of the electromagnetic field in the measurement chamber, and also with the possibility of using such a device for anechoic or semi-anechoic chambers having a variety of dimensions.

More particularly, the present invention provides a device for positioning antennas inside a measurement chamber of the anechoic type or of the semi-anechoic type, the chamber being constituted by an envelope inside which electromagnetically absorbent blocks are disposed forming absorbent walls for said measurement chamber, wherein a reserve is formed between a particular absorbent wall of the measurement chamber and the adjacent wall of the envelope of said chamber, and wherein an antenna-carrier mast assembly is movably mounted in said reserve, said mast passing through said particular wall via an associated opening therein to extend into the measurement chamber, each antenna being mounted to slide along said mast without mechanically interfering with any other antenna carried by said mast, thereby enabling the desired antenna to be positioned in the desired location within the measurement chamber while retracting the other antenna(s) into said reserve, behind said particular wall.

In a particular embodiment, the particular wall constitutes a false ceiling of the measurement chamber, and the antenna-carrier mast is suspended vertically from the moving assembly. In a variant, the particular wall constitutes a false floor of the measurement chamber, and the antenna-carrier mast is carried vertically by the moving assembly. It is even possible to envisage that said particular wall is a side wall, in which case the mast is horizontal and is cantilevered out into the measurement chamber (nevertheless, having a cantilever is less favorable to obtaining accurate displacements, so it is generally preferable to use a disposition in which the antenna-carrier mast is vertical).

Preferably, the moving assembly is a carriage displaceable in translation in the associated reserve by means of horizontally extending slideways or rails.

Also advantageously, the associated opening is constituted by a rectilinear slot extending in the displacement direction of the carriage and of a width that is selected to be just wide enough to allow the antenna-carrier mast to pass therethrough, together with a wider passage communicating with said slot, and having an outline that is selected to allow the bulkiest antenna to pass therethrough. It is then advantageous for the carriage is displaceable between two extreme positions, in one of which the antenna-carrier mast is in the vicinity of the end of the rectilinear slot and in the other of which the antenna-carrier mast is level with the wider passage.

According to a particular characteristic, the antenna-carrier mast is a section bar on which individual antenna-carrier sliders are disposed, each running along an associated track of said section bar.

It is then advantageous for the antenna-carrier mast is an I-section bar or the like, with the end flanges thereof engaging respective sliders, each carrying an antenna, e.g. a microwave horn and a triangular wire antenna. In particular, the two sliders are organized in such a manner that both antennas are always on the same side of the antenna-carrier mast.

Finally, it is preferable for the antenna-carrier mast and the support members associated with each antenna to be made of a material that is electromagnetically non-reflective, e.g. of polyvinyl chloride.

BRIEF DESCRIPTION OF THE DRAWINGS

Other characteristics and advantages of the invention appear more clearly in the light of the following description and the accompanying drawings that relate to a particular embodiment with reference to FIGS. 2 to 8, in which:

FIG. 1 illustrates a known positioning device;

FIG. 2 is a longitudinal section through a measurement chamber fitted with an antenna positioning device of the invention, the reserve being provided in this case in the ceiling, above a false ceiling;

FIGS. 3 and 4 are sections on III—III and IV—IV of FIG. 2 for distinguishing more clearly the particular structure of the positioning device;

FIGS. 5 and 6 are two fragmentary elevation views of the antenna carrying mast of the above-mentioned device level with the corresponding sliders on which the two antennas in question are mounted;

FIG. 7 is a plan view of the assembly shown in FIG. 5, in section on VII—VII of FIG. 5, while FIG. 8 is a view on a larger scale showing a detail VIII of FIG. 7.

FIGS. 9 and 10 are sections similar to the ones of FIGS. 2 and 3, showing a variant of the measurement chamber wherein the reserve is not formed above a false ceiling of the chamber as in FIGS. 2 and 3, but under a false floor of the chamber.

MORE DETAILED DESCRIPTION

FIGS. 2 and 3 show an enclosure (a Faraday cage or otherwise) 100 fitted with absorbent blocks and constituted by an envelope 101 including a ceiling 101.1, a floor 101.4, and vertical side walls 101.2, 101.3, 101.5, and 101.6. The measurement chamber 103 is defined by walls formed by electromagnetically absorbent blocks of conventional type having cones 120 and cornerpieces 121. In this case, the floor 101.4 is fully covered with electromagnetically absorbent blocks since the measurement chamber is of the anechoic type, however the invention is clearly equally applicable to a measurement chamber of the semi-anechoic type, in which the floor is covered only partially or not at all with absorbent blocks.

In accordance with an essential aspect of the invention, a reserve is formed between a particular absorbent wall of the measurement chamber and the adjacent wall of the envelope of said chamber. In the present case, this particular wall is a top wall 110 that constitutes a false ceiling for the measurement chamber 103. This particular wall 110 is constituted by a horizontal slab 102 having absorbent blocks 120 and corner members 121 disposed on the bottom face thereof. The measurement chamber 103 is thus defined by said top wall 110 that constitutes the ceiling thereof, the bottom wall 112 constituting the floor thereof and four side walls 111. In this case, the reserve 104 constitutes a particular increase in height compared with a conventional chamber.

An assembly 130 including an antenna-carrier mast 131 is movably mounted in said reserve 104, said mast passing through the particular wall 110 via an associated opening 105 therein, thereby enabling it to extend into the measurement chamber 103. The moving assembly 130 shown herein comprises a carriage 132 that is movable in translation inside the associated reserve 104 by means of two horizontally-extending slideways or rails 134, said carriage being held by means of associated wheels 133 and the slideways or rails 134 being fixed on the bottom face of the top partition 101.1 of the envelope 101. The antenna-carrier mast 131 is then suspended vertically down from the moving assembly 130. In the device shown herein, the moving assembly supports a single mast 131 that carries two antennas 50 and 51, however it is clear that this merely constitutes one possible example and that it would be possible to provide an antenna-carrier mast whose structure enables it to carry in slidable manner more than two antennas, and/or to provide a second mast which is secured to the same carriage that is movable in translation, the second mast itself carrying one or more antennas, Each antenna 50, 51 is mounted to slide along the mast 131 without mechanically interfering with any other antenna carried by the said mast, thereby making it possible to position the desired antenna at the appropriate height inside the measurement chamber 103 while simultaneously retracting the other antenna(s) into the reserve 104 behind the particular wall 110. The associated coaxial connections (not shown) are preferably integrated in the antenna-carrier mast 131.

The moving equipment constituted by the carriage 132 and by its antenna-carrier mast 131 is thus longitudinally displaceable, and FIG. 2 shows two extreme positions of said moving equipment. Continuous lines are used for showing a position that corresponds to the desired antenna being selected and to the other antenna(s) being raised into the reserve 104. Dot-dashed lines are used for showing the other extreme position which is one of the positions in which the corresponding test or measurement is performed using the selected antenna, in this case a microwave horn 51, while the other antenna(s), in this case a wire antenna 50 is/are retracted into the reserve 104 behind the wall constituting the false ceiling of the measurement chamber 103. The selected antenna is naturally positioned at the desired height by means of a slider system as described below, and as represented by arrow 201.

If it is desired to use the wire antenna 50 instead of the microwave horn 51, it suffices, starting from the position shown in chain-dotted lines, to displace the carriage 132 together with its antenna-carrier mast 131 towards its other end position, and then to raise the microwave horn 51 and to lower the wire antenna 50 to the desired height, and finally to displace the carriage 132 again together with its antenna-carrier mast into a new measurement position which may be the position shown in chain-dotted lines in FIG. 2, or a position close thereto. In this new position, the wire antenna 50 is used in normal manner as though it were the only antenna on the mast, while the microwave horn 51 is confined inside the reserve 104. The horizontal displacement of the carriage is represented by arrow 200.

It will readily be understood that the retracted antenna gives rise to no disturbance of the electromagnetic field that obtains inside the measurement chamber 108 because the presence of the particular absorbent wall 110 completely isolates the antenna that has been hidden from said measurement chamber. In addition, antenna changeover can be performed quickly, and above all there is no need to gain access to the inside of the enclosure.

The opening 105 whereby the antenna-carrier mast passes through the false ceiling of the measurement chamber must therefore be of such a shape as to minimize electromagnetic reflection. Thus, as can be seen more clearly in FIG. 4, the opening 105 is constituted in this case by a rectilinear slot 106 extending in the direction that corresponds to the displacement direction 200 of the carriage 132 and of a width l that is selected to be just large enough to allow the antenna-carrier mast 131 to pass therethrough, and including a wider passage 107 communicating with said slot, the outline 107.1 of said wider passage being selected to allow the largest antenna to pass therethrough, i.e. in this case the wire antenna 50. The carriage 132 is then displaceable between two extreme positions, including a position illustrated by chain-dotted lines in which the antenna-carrier mast 131 is close to the end 108 of the rectilinear slot 106, and another position shown in continuous lines in which the antenna-carrier mast 131 is level with the wider passage 107. In this latter position, the wire antenna 50, in this case an antenna that is triangular in shape, is in exact vertical register with the matching outline forming the passage 107, said larger passage terminating at an end 109 in a slot that allows the sliders to pass that carry the antennas 50 and 51, thereby making it possible to raise one or other of said two antennas freely into the reserve 104.

To further improve electromagnetic absorption, provision is also made in the ceiling of the reserve 104 and in the enlarged passage of the false ceiling for receiving absorbent blocks 120 and 121 analogous to those mentioned above that form the walls of the measurement chamber 103.

As mentioned above, it is possible to ensure that the particular absorbent wall delimiting the reserve constitutes a false floor for the measurement chamber as illustrated at FIGS. 9 and 10: under such circumstances, the antenna-carder mast 131 is carded vertically by a cardage 132 which moves in the associated reserve 104 underneath the floor wall 112 (which is a false floor in that case) of the measurement chamber 103, the mast 13 1 then passing through an opening 105 in a horizontal slab 102 having absorbent blocks 120 and corner members 121 disposed on the top face thereof. The movable assembly 130 is identical to the one of the embodiment already described and the same applies for opening 105 provided in the floor wall which is given the same shape as the slot opening 106 with the wider passage 107 as shown at FIG. 4.

With reference to FIGS. 5 to 8, there follows a description of a particular embodiment of the mounting for the two above-mentioned antennas 50 and 51 on the antenna-carrier mast 131, said mounting being such as to make it possible to position either antenna at a desired height while retracting the other antenna which is not in use and while ensuring that there is no mechanical interference between the antennas.

The antenna-carrier 131 may be an I-section bar or the like, on which individual sliders 135 and 137 are disposed that move vertically along the section bar. Given that the mast 131 carries only two antennas in this case, it is possible to use the flanges 131.1 and 131.2 at opposite ends of the web of the I-section to constitute tracks each associated with a respective one of the sliders 135 and 137. Thus, the slider 135 associated with the wire antenna 50 has an outline (rectangular in this case) that is wide enough to allow the other antenna 51 which is constituted in this case by a microwave horn to pass therethrough together with the slider associated therewith. The slider 135 is secured to the flange 131.1 by means of two contact rollers 140, with holding being provided by two pairs of wheels 141 bearing against the opposite face of the flange 131.1, the roller 140 and the wheels 141 being carried by a bracket 144 that is rigidly secured to the rear face of the slider 135. It is thus ensured that the slider 135 is kept accurately horizontal, while its height may be adjusted by any appropriate means, e.g. a halyard 146 connected to a hoist member (not shown). On the other side, the slider 135 is fitted with an elongate support 136 that terminates in a stud 139 on which the wire antenna 50 is mounted. For the microwave horn 51, there is in similar manner a slider 137 fitted with an antenna support 138, this slider running by means of rollers 142 against the other flange 131.2 of the I-bar, and being held thereto by means of wheels 143, the rollers 142 and the two pairs of wheels 143 being carried by a bracket 145 secured to the slider 137 in a configuration that is symmetrical to that described above for the slider 135. The height of the microwave horn 51 can then be adjusted by means of a halyard 147 likewise connecting to a hoist member (not shown herein).

Such an organization makes it possible to displace each of the antennas vertically, firstly for the purpose of locating each antenna at the desired height, and secondly for raising the other antenna into the reserve of the enclosure 100 in order to retract said other antenna. The above-described disposition has the advantage that both of the antennas 50 and 51 are always disposed on the same side of the antenna-carrier mast 131. As a result, the selected antenna is always disposed in a position where it is ready for measurement purposes. A different disposition Gould have been provided, but with an organization including an antenna-carrier mast 131 that is rotatable, with rotation of the mast about a vertical axis enabling the selected antenna to be brought to the desired position on the measurement axis.

The antenna-carrier mast 131 and the support members 135 to 147 associated with each of the antennas 50 and 51 are preferably all made of a material that is electromagnetically non-reflective, e.g. polyvinyl chloride.

If it is desired to have more than two antennas available, it is possible to chose a bar of different section, e.g. of cruciform section, with each branch of the bar then carrying an individual slider on which a corresponding antenna is mounted. The through opening in the false ceiling must then be designed accordingly so as to enable those antennas which are not in use to be retracted.

The structure of the device described above is entirely applicable to measurement chambers of large dimensions, e.g. having a height of 6 meters and a length of 9 meters. The slideways or rails on which the displaceable carriage is mounted make it possible to achieve accuracy of the order of 1 millimeter, such that the selected antenna is always correctly directed with excellent accuracy for performing the desired test or measurement.

An antenna positioning device is thus provided that makes it possible firstly to use two or more antennas without requiring an antenna to be dismantled, and secondly that enables antennas to be changed quickly, without such a change of antenna giving rise to significant disturbances of the electromagnetic field in the measurement chamber, and also with the option of using such a device in anechoic or semi-anechoic chambers of various dimensions.

The invention is not limited to the embodiment described above, but on the contrary it extends to any variant that uses equivalent means to reproduce the essential characteristics specified above.

I claim:

1. A device for positioning antennas inside an anechoic or semi-anechoic measurement chamber, the chamber being constituted by an envelope inside which electromagnetically absorbent blocks are disposed forming absorbent walls for said measurement chamber, wherein a reserve is formed between a particular absorbent wall of the measurement chamber and the adjacent wall of the envelope of said chamber, and wherein an assembly is movably mounted in said reserve, said movable assembly including an antenna carder mast which passes through said particular wall via an associated opening therein to extend into the measurement chamber, each antenna being mounted to slide along said mast without mechanically interfering with any other antenna carried by said mast, thereby enabling the desired antenna to be positioned in the desired location within the measurement chamber while retracting the other antenna(s) into said reserve, behind said particular wall.

2. A device according to claim 1, wherein the particular wall constitutes a false ceiling of the measurement chamber, and the antenna-carrier mast is suspended vertically from the movable assembly.

3. A device according to claim 1, wherein the particular wall constitutes a false floor of the measurement chamber, and the antenna-carrier mast is carried vertically by the movable assembly.

4. A device according to claim 2, wherein the movable assembly is a carriage displaceable in translation in the reserve by means of horizontally extending slideways or rails.

5. A device according to claim 1, wherein the movable assembly is a carriage displaceable in a direction, the associated opening being constituted by a rectilinear slot extending in the displacement direction of the carriage and of a width that is selected to be just wide enough to allow the antenna-carrier mast to pass therethrough, together with a wider passage communicating with said slot, and having an outline that is selected to allow a bulky antenna to pass therethrough.

6. A device according to claim 5, wherein the carriage is displaceable between two extreme positions, in one of which the antenna-carrier mast is in the vicinity of the end of the rectilinear slot and in the other of which the antenna-carrier mast is level with the wider passage.

7. A device according to claim 1, wherein the antenna-carrier mast is a section bar on which individual antenna-carrier sliders are disposed, each running along an associated track of said section bar.

8. A device according to claim 7, wherein the antenna-carrier mast is an I-section bar, with the end flanges thereof engaging respective sliders, each slider carrying an antenna.

9. A device according to claim 8, wherein the sliders are organized in such a manner that both antennas are always on the same side of the antenna-carrier mast.

10. A device according to claim 1, wherein the antenna-carrier mast associated with each antenna is made of a material that is electromagnetically non-reflective.

* * * * *